United States Patent [19]

Leedy

[11] Patent Number: 4,924,589
[45] Date of Patent: May 15, 1990

[54] METHOD OF MAKING AND TESTING AN INTEGRATED CIRCUIT

[76] Inventor: Glenn J. Leedy, 1061 E. Mountain Dr., Santa Barbara, Calif. 93108

[21] Appl. No.: 194,596

[22] Filed: May 16, 1988

[51] Int. Cl.$^5$ ............................................. H05K 3/30
[52] U.S. Cl. ...................................... 29/832; 29/407; 29/846
[58] Field of Search .................. 437/8; 324/73 PC; 29/846, 832, 407, 593

[56] References Cited

U.S. PATENT DOCUMENTS

| | | | |
|---|---|---|---|
| 3,405,361 | 10/1968 | Kattner et al. | |
| 3,618,201 | 11/1971 | Makimoto et al. | 437/8 |
| 3,702,025 | 11/1972 | Archer | 437/8 |
| 3,762,037 | 10/1973 | Baker et al. | 437/8 |
| 3,781,670 | 12/1973 | McMahon, Jr. | 324/73 PC X |
| 3,795,972 | 3/1974 | Calhoun | 437/8 |
| 3,795,975 | 3/1974 | Calhoun et al. | 437/8 |
| 3,835,530 | 9/1974 | Kilby | 437/8 |
| 3,969,670 | 7/1976 | Wu | 437/8 X |
| 3,993,934 | 11/1976 | Baker et al. | 437/8 X |
| 4,573,008 | 2/1986 | Lischke | |
| 4,590,422 | 5/1986 | Milligan | |
| 4,617,730 | 10/1986 | Geldermans et al. | |
| 4,715,928 | 12/1987 | Hamby | |

OTHER PUBLICATIONS

IBM Tech. Discl. Bull., vol. 10, No. 10, Mar. 1968, pp. 1466–1467 by Dill et al.

*Primary Examiner*—Carl J. Arbes
*Attorney, Agent, or Firm*—Skjerven, Morrill, MacPherson, Franklin & Friel

[57] ABSTRACT

Each transistor or logic unit on an integrated circuit wafer is tested prior to interconnect metallization. By CAD means, the transistor or logic units placement net list is revised to substitute redundant defect-free logic units for defective ones. Then the interconnect metallization is laid down and patterned under control of a CAD means. Each die in the wafer thus has its own interconnect scheme, although each die is functionally equivalent, and yields are much higher than with conventional testing at the completed circuit level.

The individual transistor or logic unit testing is accomplished by a specially fabricated flexible tester surface made in one embodiment of several layers of flexible silicon dioxide, each layer containing vias and conductive traces leading to thousands of microscopic metal probe points on one side of the test surface. The probe points electrically contact the contacts on the wafer under test by fluid pressure. The tester surfaces traces are then connected, by means of multiplexers, to a conventional tester signal processor.

20 Claims, 16 Drawing Sheets

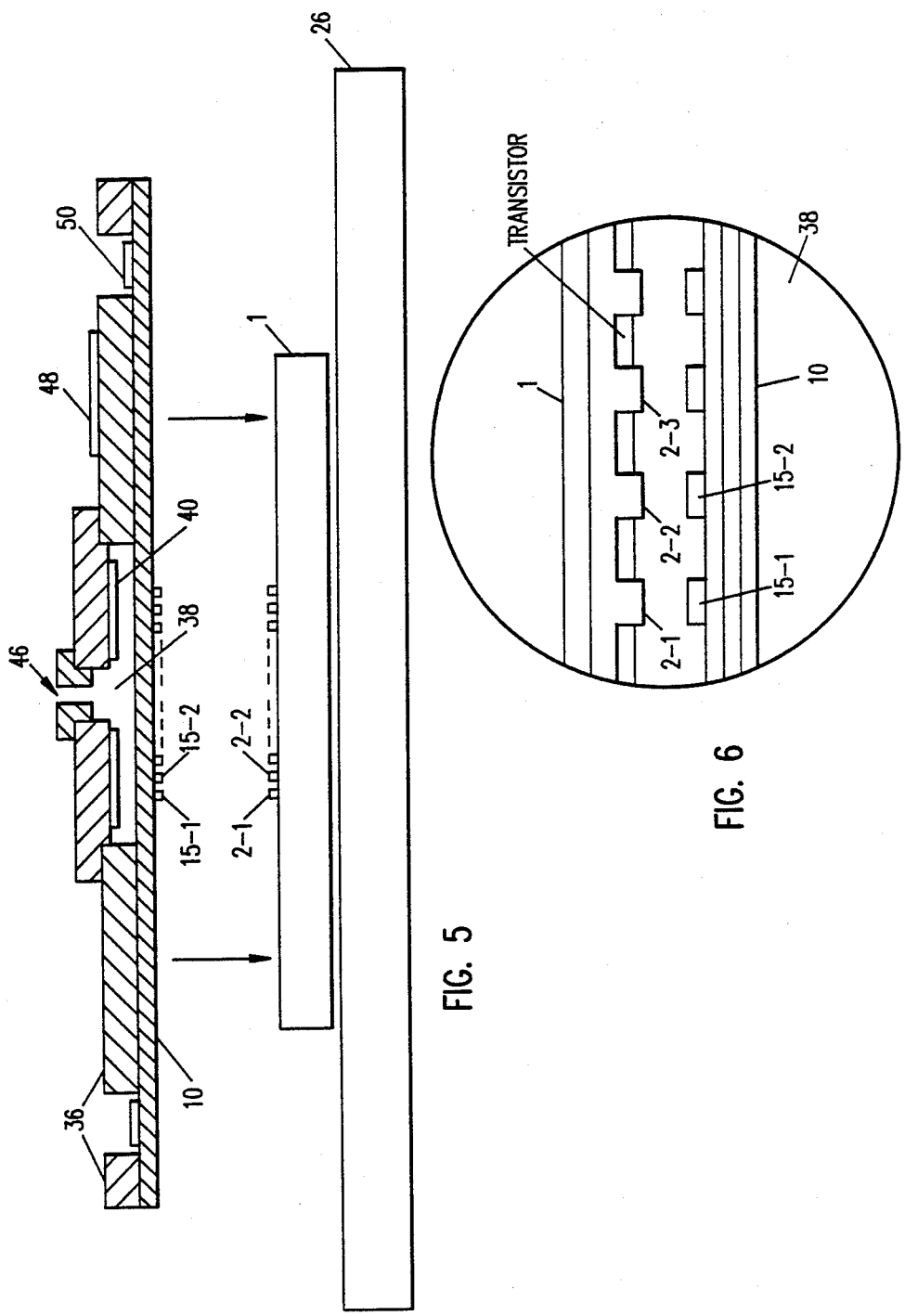

METHOD OF MAKING AND TESTING AN INTEGRATED CIRCUIT

BACKGROUND OF THE INVENTION

1. Field of the Invention

This invention relates to a method of making and testing integrated circuits, and a device used to perform such testing.

2. Description of the Prior Art

Integrated circuits (ICs) comprise active and passive elements such as transistors, diodes, resistors, and capacitors, that are interconnected in a predetermined pattern to perform desired functions. The interconnections are effectuated by means of metallization layers and vias. A "via" is a hole through an insulation layer in which conductor material is located to electrically interconnect one conductive layer to another or to an active or passive region in the underlying semiconductor substrate. Present day technology generally employs two metallization layers that are superimposed over the semiconductor wafer structure. Integrated circuits and assemblies have become more complex with time and in a logic circuit, the number of integrated circuit logic units (ICLUs) and interconnects on a given size die have been substantially increased reflecting improved semiconductor processing technology. An ICLU can be a device (such as a transistor), a gate (several transistors) or as many as 25 or more transistors and other devices.

Standard processing to make logic structures (i.e., gate arrays) includes fir fabricating as many as half a million transistors comprising a quarter of a million gates per die. Each semiconductor wafer (typically silicon but sometimes of other material such as gallium arsenide) includes many die, for example, several hundred. In one type of gate array, for example, the transistors are arrayed in rows and columns on each die, and each transistor is provided with conductive contact points (typically metal but sometimes formed of other conductive material such as polycrystalline silicon), also arrayed in rows and columns.

As is well known in the art, these conductive contact points have a typical center-to-center spacing of about 6 to 15 microns ($\mu$m).

In the prior art, the next step is to use fixed masks to fabricate the conductive layers (sometimes called "metallization layers"), to connect together the individual gate-array devices. Typically two or sometimes three metalization layers are used.

After this, the completed die is tested. If any of the devices on the die are defective, that die will fail an exhaustive test and be scrapped. Therefore, the more transistors per die the lower the manufacturing yield. In some cases redundant sections of a circuit are provided that can be substituted for defective sections of a circuit by fuses after metallization. Typically such redundant sections can be 5% to 10% of the total circuit.

SUMMARY OF THE INVENTION

An object of this invention is to provide an improved test procedure for integrated circuits to increase production yields, by testing a circuit at the ICLU level (hereinafter called "fine grain testing"), compared to conventional testing at the functional IC or die level.

Another object is to permit the fabrication of very large integrated circuits, in terms of number of ICLUs or devices per circuit.

The present invention improves on prior art by testing each ICLU prior to metallization. Redundant UCLUs are provided on the die to substitute for those found to have defects. Then the metallization layers are fabricated so as to exclude defective ICLUs and substitute good ones from the redundant group and render the circuit operable. The present invention uses a fine grain testing approach, by testing at a low level of complexity.

One key to the present invention is a specially fabricated flexible test means made of flexible silicon dioxide in one embodiment and including multi-layer metal interconnects and microscopic test points. The flexible tester means includes a tester surface, connected to test equipment, that permits testing of each device. Then by CAD (computer aided design) means, each die is metallized and the metal layer is patterned by suitable means, such as E-beam processing, to fabricate discretionary metallization interconnect layers of individual gate array devices.

The tester surface is formed on a standard silicon wafer typically by means of a low stress chemical vapor deposition process. The tester surface includes its own metallization layers. On one side of the tester surface are thousands of probe points to contact the contact points on the wafer under test. The tester surface is a special flexible form of silicon dioxide which can be pressed flexibly against the wafer under test to achieve good electrical contact.

By eliminating defects at the device level, process yield is vastly increased—for example to about 90% regardless of die size, in contrast to much lower yields using prior art technology. The present invention also allows successful fabrication of very large die compared to conventional technology.

BRIEF DESCRIPTION OF THE DRAWING

FIG. 5 shows the fluid pressure test assembly.

FIG. 6 shows an exploded view of the wafer and tester surface.

Figure 1:
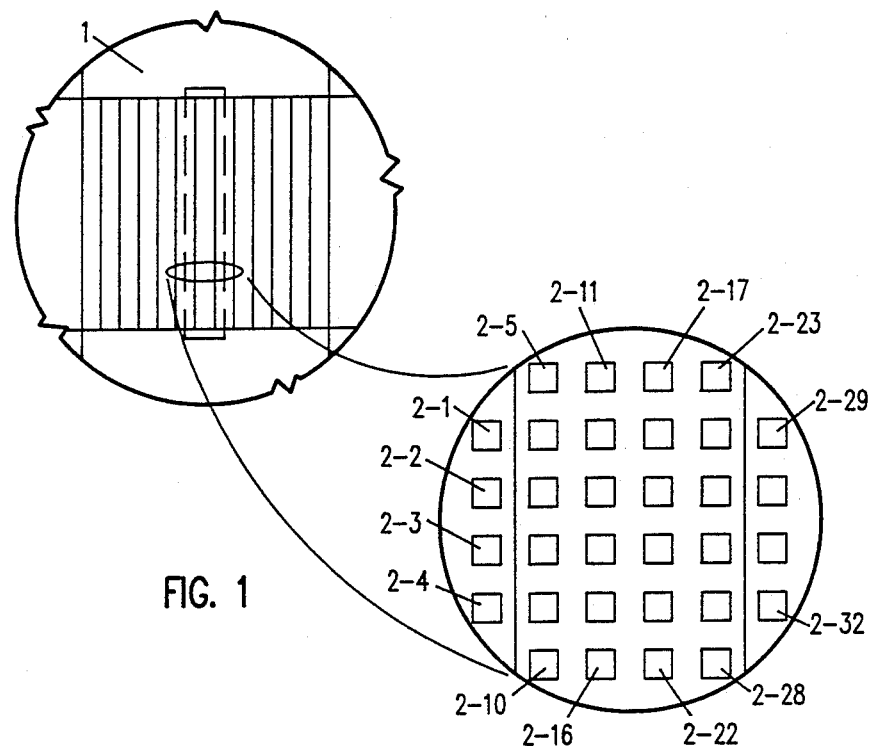
FIG. 1 shows a section of a gate array wafer and the device contacts.

Each reference numeral when used in more than one Figure refers to the same structure.

DETAILED DESCRIPTION

As stated above, the prior art fabricates a plurality of transistors on a die, interconnects the transistors to form desired logic, tests the entire die, and scraps the die if the logic doesn't work. In the present invention, after fabricating the transistors exactly as before, the transistors or ICLUs are tested individually. Then the interconnect scheme is modified, if necessary, by CAD means (of well known design) to bypass defective transistors or ICLUs and substitute, logically speaking, replacement ICLUs. Then the metallization layers are deposited, and patterned in accordance with the modified interconnect scheme typically by E-beam (Electron-beam) lithography, instead of the masking process of the usual conventional scheme, even though each die is to carry out the same function as the other die.

The present invention in one embodiment begins with a gate array conventionally fabricated on a silicon or GaAs wafer. The gate array transistors are arrayed in columns and rows on the wafer surface 1, and the active regions of each transistor are provided with contact points such as 2-1 to 2-32 which are in columns and rows also as shown in FIG. 1 (not all contact points are numbered). Redundant (or extra) devices are designed into each column, with a redundancy factor dependent on the expected yield of the individual transistors of ICLUs being tested.

The surface of the wafer 1 is optionally planarized with a cured layer of polymide 0.8 to 1.5 micron thick if the step heights between contact points are greater than 0.5 microns. (The contact points 2-1 to 2-32 are masked from the polymide, and metal is deposited to fill the via.)

The fabricated (but not metallized) wafer 1 is now ready for testing. In the described embodiment, only one column of transistors on each die is tested at a time, although testing more than one column per step is possible. For a die of typical complexity this requires making contact with all of the perhaps 10,000 or so contact points such as 2-1 to 2-4 in one column simultaneously, and then stepping across all 100 or 200 or more columns in each die, to totally test each die in step-and-repeat fashion. Each contact point such as 2-1 is small—usually 4×4 microns. Each wafer contains a plurality of die, the exact number depending on the size of the wafer but typically being in the hundreds.

It is also therefore possible to test more than one column at once to perform testing on the ICLU's.

Figure 2:
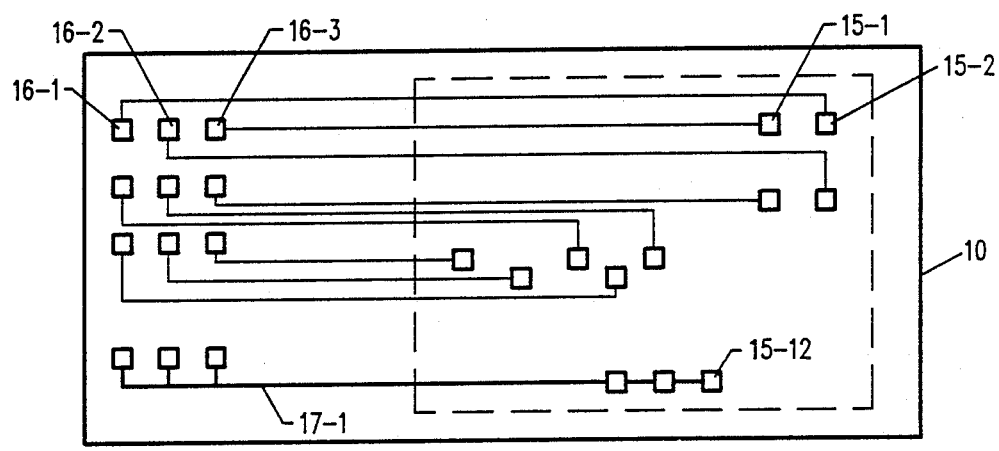
FIGS. 2-3 show a top and side view of part of the tester surface.
Figure 3:
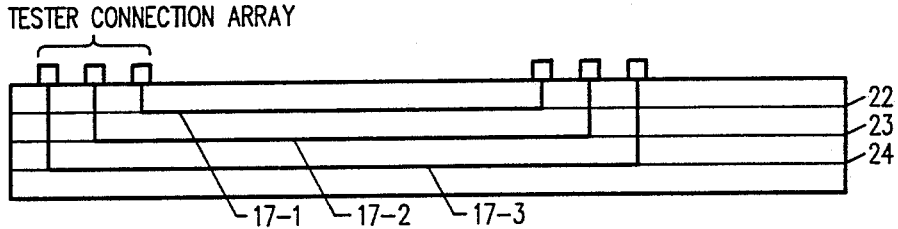
Figures 4A, 4B:
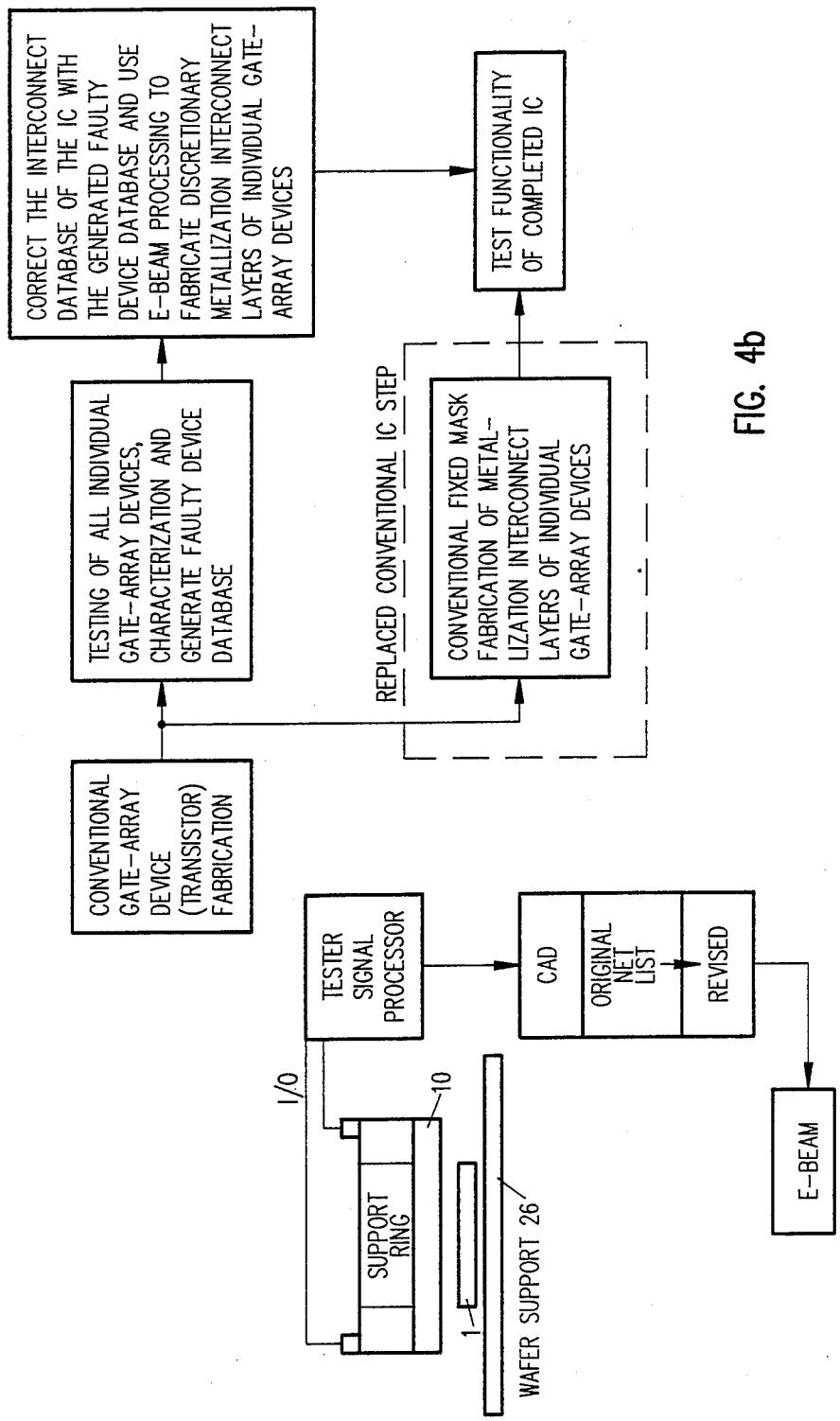
FIGS. 4(a) and 4(b) show the test procedure.

The flexible tester of this invention includes a tester surface 10 (described in detail below) as seen in FIG. 2 which includes a series of tester surface contact points including 15-1, 15-2 (which are arranged to contact on a one-to-one basis the corresponding contact points in a column on the die under test) and a complete wiring interconnection, including a testing array which includes contacts 16-1, 16-2 and 16-3 and interconnect pathways 17-1, 17-2 and 17-3 as seen in FIG. 3, at various levels 22, 23, 24 in the tester surface. The tester array which includes contacts 16-1, 16-2 and 16-3 connects to a conventional tester signal processor as shown in FIG. 4a having line driver logic circuits for accessing serially or in parallel the devices under test. The driver logic signals are programmed separately in a well known manner and are multiplexed between testing array contacts 16, providing programmable input/output means for supplying diagnostic signals to the transistors or ICLUs under test. Therefore, all the wafer contact points in one column can be accessed in one physical contact step of the transistors or devices to be tested.

The wafer 1 under test and the tester surface 10 are disposed on a support 26, as shown schematically in FIG. 4(a), for test purposes, to electrically connect the contact points on the tester surface 10 and corresponding contact points on the wafer 1. FIG. 4(b) shows the test procedure in process-flow format. A fluid well or bladder (not shown) is used to exert an uniform pressure over the flexible tester surface 10 (FIG. 4(a)) in order to conform it to the surface of the wafer 1 under test and to ensure that the numerous corresponding contact points on the tester surface 10 and the wafer 1 come together and make firm electrical contact. This is possible due to the fact that the surface of the wafer 1 under test typically has a controlled total runout flatness within 6 to 10 microns across its complete surface. Secondly, the tester surface 10 is less than 15 microns thick and typically 1.5 microns thick and of a very flexible material, such as low stress silicon dioxide. Thirdly, the metal contact points are the highest raised surface features on either the tester surface 10 or the surface of the wafer 1 under test, and are of a controlled uniform height typically between 2 and 6 microns.

The wafer 1 under test as shown in FIG. 4(a) is mounted on an x-y motion table (not shown). Movement of the table in the x-y directions positions the wafer for test by alignment of the contact points such as 15-1 and 15-2 of the test surface 10 (FIG. 2) with the corresponding device contact points such as 2-1 and 2-2 of the wafer 1.

During the test procedure as shown in FIG. 4(a), the wafer 1 under test is retained by suction in a substantially planar fixed position, by means of the support 26 illustrated in FIG. 4(a) and in FIG. 5. Use of suction to hold a wafer in place is well-known. Tester surface 10 is mounted on a support ring 36 (as described below) to provide mechanical support and electrical connections, as shown in FIG. 5. The tester surface 10 is urged uniformly toward the wafer 1 under test by a fluid well or bladder 38 immediately behind tester surface 10. A solenoid (not shown) is provided for macro control of the pressure exerted by the fluid in the fluid well 38 on tester surface 10. The depth of fluid well 38 is less than 100 mils; this is the distance between the back of tester surface 10 and piezoelectric pressure cell 40.

Piezoelectric pressure cell 40 is a layer of material about five-hundredths of an inch (one millimeter) thick that will expand about one-half micron when voltage is applied to the piezoelectric material. The applied pressure on the back of the tester surface 10 is only a few grams per square centimeter. Piezoelectric pressure cell 40 provides the last increment of pressure on the fluid and in turn on the back of tester surface 10 to achieve good electrical contact between the contact points such as 15-1 and 15-2 on tester surface 10 and the contact points such as 2-1 and 2-2 on wafer 1. The fluid is provided to the assembly through fluid port 46 which is connected to a fluid reservoir (not shown). The support ring 36 includes computer cabling attachment sites 48 and multiplexer circuits 50. The support ring structure is described in more detail below.

As described above, mechanical positioners (i.e., x-y table aligners and conventional mechanical vertical positioners, not shown) bring the wafer 1 to within a few mils of the tester surface 10 and make a first approximation of the alignment of contact points through a conventional optical aligner (not shown). The optical alignment is performed in a manner similar to that used by present semiconductor mask aligners, by using alignment patterns in predetermined positions on both the wafer 1 being tested and the tester surface 10. Only the pressure of the fluid moves the tester surface 10 the one or two mil distance separating the tester surface 10 and the wafer 1 to be tested in order to gain physical contact. FIG. 6 illustrates in an exploded view wafer 1 and tester surface 10 being moved by fluid pressure from fluid well 38 just before wafer contact points such as 2-1 and 2-2 make contact with corresponding tester surface contacts such as 15-1 and 15-2.

In an additional alignment method, a small area (not shown) with a pattern of alignment contact points of various sizes up to 1 mil (25 microns) square and positioned at two or three corresponding alignment sites on both the wafer 1 and the tester surface 10 is then used as an electrical circuit feedback system. The feedback system, starting with the largest contact points at each site and moving progressively to the smallest, determines the accuracy of the alignment and makes appropriate micron sized adjustments under computer control to within sub-micron x–y alignment accuracy.

In the described embodiment, the fluid in the test surface assembly is Florinert from DuPont. Any alternate fluid with similar nonconductive and nonreactive properties could be substituted.

After an entire wafer 1 has been tested, it is removed and another wafer moved into position to be tested.

The data resulting from the tester signal processor is a list of the location of each defective transistors or ICLUs. This list is automatically communicated to the conventional CAD means from the tester signal processor as shown in FIG. 4. The CAD means then, by special software algorithms works out an interconnect strategy for each die. Therefore, the master placement scheme of the net list is modified in terms of the placement of the defective ICLUs so as to bypass the defective ICLUs and interconnect defectfree ICLUs from the stock of redundant ICLUs.

The invention uses two alternative software algorithms: recomputation of metallization trace routing or a CAD rip-up router.

The first alternative is the well-known and commercially available recomputation of the metallization trace routing for all affected layers of a specific IC after it has been tested. The routing is performed automatically with CAD software. This routing procedure requires that sufficient defect-free redundant ICLUs have been allocated in the master placement of ICLUs and that the redundant ICLUs can be routed into the circuit given the potential restrictions that the number of metallization layers may present. The software that precedes this processing performs the entry into a CAD system of the placement net-list change commands that direct the substitution of the defective ICLUs with available redundant ICLUs. These change commands are specific to the CAD system that is selected for use, and the commands issued are similar to those a circuit designer would enter if making an ICLU placement select in a design change when using a gate-array This recomputation routing approach makes substantial requirements on computing resources. However, super-minicomputers presently available are sufficient to meet the computational requirements.

The second software alternative, a CAD rip-up router, takes advantage of the knowledge that the defects occurring in current bulk silicon semiconductor processes are few in number and are localized (i.e., the defects only affect one or two ICLUs at any particular defect site), and of the fine grain ICLU structure. The fine grain level of testing minimizes the area necessary for redundant ICLUs and the complexity of the placement and routing changes that must be effected to correct for defective ICLUs. Wafer or large ICs that indicate larger than normal numbers of defects or defects that are large in affected area when tested by testing equipment will cause the wafer to be rejected as outside of the acceptable bulk manufacturing standards which are typical of all existing IC lines. The number of defects to be expected with standard available silicon wafers is approximately five per $cm^2$ currently. This means that approximately five or less ICLUs can be expected to be defective per $cm^2$. The number of defects per $cm^2$ increase as device feature sizes decrease, but not dramatically, as indicated by the current industrial use of 0.8 micron geometries for 4 Megabit memory devices, which will soon be in limited production.

This rip-up router software process approach takes advantage of this wafer ICLU defect density characteristic by employing a CAD rip-up router. This CAD software tool has only become available recently and heretofore was only used during the design phase of a large IC in an effort to conserve designer and computer time. The rip-up router attempts to make local changes to existing IC metallization layout and, therefore, avoiding the expense of recomputing the complete IC's metallization trace routing. The rip-up router is an automatic tool; it accepts change commands to the ICLU placement net-list and then computes changes to the IC's metallization database. This modified IC metallization database is then processed for input to the E-beam lithographic equipment; this processing software is the standard software used to drive the E-beam equipment. The computer processing time required to do local rip-up route changes has been measured and found to be typically 1 to 2 seconds on an inexpensive 32-bit minicomputer.

The modified net list is next used to produce the database for the desired interconnect patterns on the wafer using E-beam means. The metallization process is in one embodiment a two layer metallization, although a single layer of metallization or three or more layers of metallization can also be used. The process involves depositing a layer of insulation, such as silicon dioxide, typically of about one micron thickness over the wafer surface, and cutting vias by means of a mask to the contact points on the wafer surface through the silicon dioxide layer. Then a layer of metal, typically aluminum, is deposited over the silicon dioxide. Then a layer of photoresist is deposited and patterned, for example using E-beam (maskless) lithography. The E-beam is controlled by the CAD database means and its modified net list to make the desired interconnect pattern corrected in accordance with the test results. The photoresist is then developed and removed where not exposed to the E-beam, allowing the patterning of the interconnects as desired.

The metallization process is then repeated for the second metallization layer and any subsequent metallization layers. The metallization process is generally well known technology, the innovation being that the net list is modified for each die even though the function to be implemented on each die is identical.

At this point the wafer is complete, ready for scribing, packaging and final test as usual.

The tester surface as mentioned above is a key element of this invention.

Figure 7:
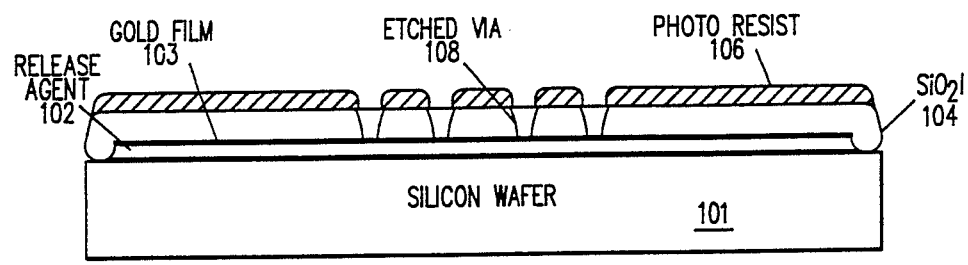
FIGS. 7-12 show the steps to fabricate the tester surface.
Figure 8:
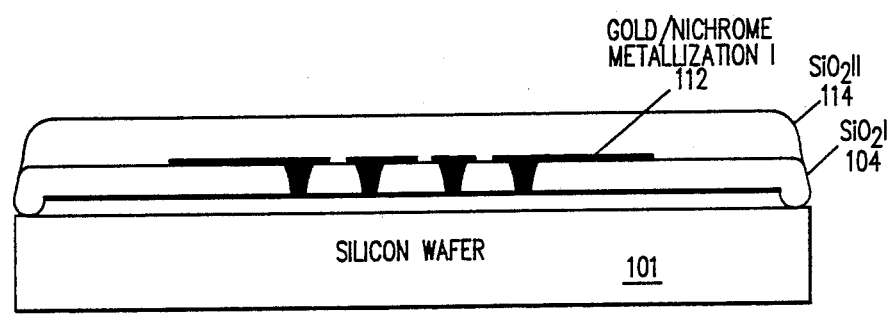

The tester surface is specially fabricated using advanced semiconductor manufacturing methods. Starting as shown in FIG. 7 with typically a conventional 5" or 6" silicon wafer substrate 101 (without any circuitry on it), a layer of KBr or other release agent 102 is deposited over the wafer 101 surface, followed by a layer of gold 103 about 1000 Å (0.1 micron) thick. Then a layer of silicon dioxide 104 of about one micron thickness is deposited on the wafer 101 surface by means of chemical vapor deposition. This is a low stress layer, deposited at about 100° F., using commercially available systems such as provided by Ionic Systems (Milpitas, Calif.) or ASM Lithography, Inc. (Tempe, Ariz.). The silicon dioxide layer 104 has a surface stress of about $10^5$ dynes/cm$^2$, making it very flexible. Then, using conventional mask methods and photoresist layer 106 as described above, vias such as 108 are etched, down to the gold layer, in the silicon dioxide layer 104 to define the probe points. The vias such as 108 are 2 to 4 microns in diameter.

The tester surface, in the preferred embodiment, has two similar gold metallization layers on top of the wafer. The first metallization layer is formed by first depositing, over the KBr layer 102, a silicide layer (not shown) 1000 Å to 2000 Å (0.1 to 0.2 microns) thick to act as an etch stop. Then the silicide deposition is removed from all but the vias 108. A nichrome/gold metallization-I layer 112 is deposited, to a thickness of 1000 to 2000 Å, and a first layer metal mask and etch are used to define the interconnect lines by forming traces.

Figure 9:
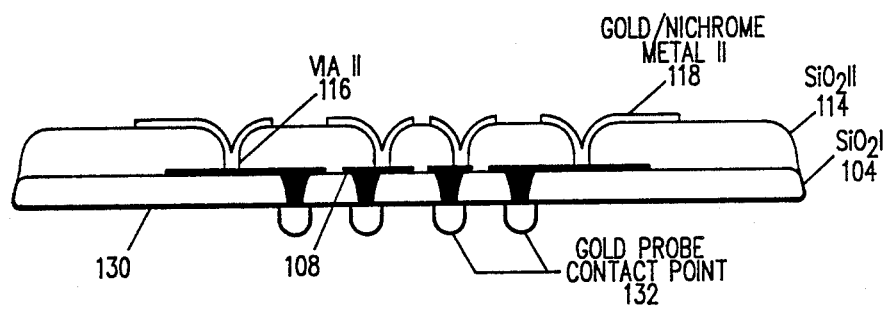

Then a second silicon dioxide layer 114, also about one micron thick, is deposited, followed by the second layer via 116 masking, second layer via etching, nichrome/gold metallization layer-II 118 and second layer metal mask and etch as shown in FIG. 9.

Figure 10:
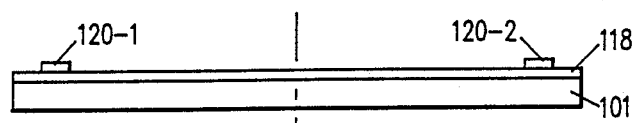

Next, customized multiplexer circuits such as 120-1 and 120-2 as shown in side view in FIG. 10 are attached to the metallization-II layer 118. These multiplexers 120-1 and 120-2 are individual die that contact the metallization-II layer 118 traces as desired, to provide electrical connections to the tester signal processor. The multiplexers such as 120-1 and 120-2 are dispersed around the outer part of the metallization-II layer 118 on the wafer 101, and serve as programmable input/output means.

Figure 11:
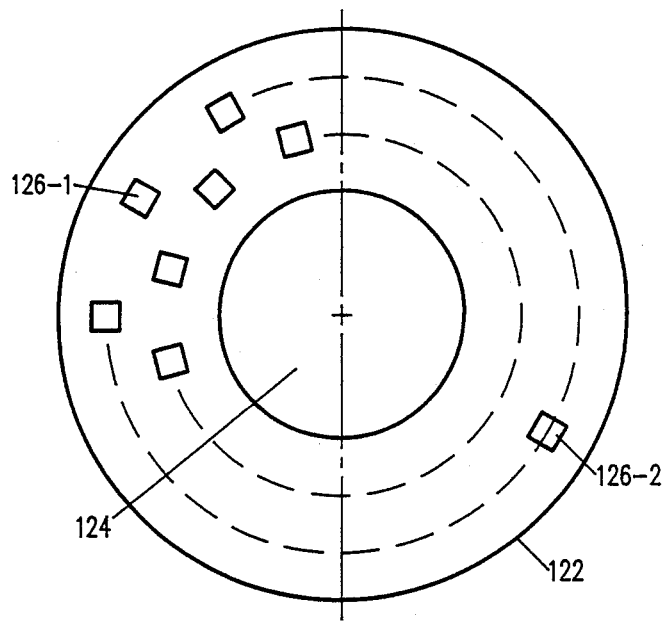
Figure 12:
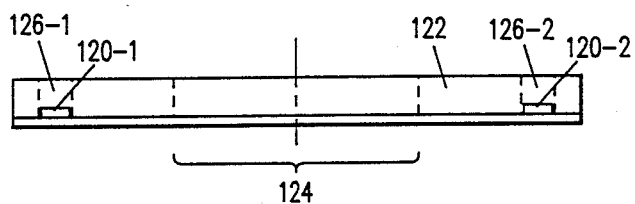

Next a mechanical structure called a support ring 122, as shown in top view in FIG. 11, and in side view in FIG. 12, is bonded with epoxy adhesive to the metallization-II layer 118 on top of the wafer 101. The support ring 122 is typically a quartz annulus (ring) of the same outer diameter as the wafer substrate 101 and an inner diameter of 1 to 2 inches.

The quartz support ring 122 is in one embodiment 0.1 inch thick. Its inner area 124 (see FIG. 11) is the contact area of the test surface. The ring 122 thus supports the actual contact area 124 and provides electrical connections to the remainder of the test system. The support ring 122 has holes such as 126-1 and 126-2 (FIGS. 11,12) machined into it to accommodate the multiplexer circuits including 120-1 and 120-2 as shown in FIG. 12.

The support ring 122 and its underlying silicon dioxide and metal layers are now released from the underlying silicon wafer 101 shown in FIG. 9. The release agent KBr (or similar material) was the material first deposited on the wafer 101. By means of the release agent, scribing around the edge of the support ring and then dipping the assembly shown in FIG. 12 in water allows the silicon dioxide layers to be peeled off the wafer 101. Alternatively, without the use of KBr, release can be achieved by etching the wafer 101 away in an ethylene-diamine solution.

Next, with the tester surface free of the wafer 101, the first gold deposition layer 103 shown in FIG. 7 is stripped off, leaving the exposed gold-filled vias such as 108 on the released surface 130 as shown in FIG. 9.

To complete the tester surface, probe points are grown on the released surface, so that the probe points grow out from the vias such as 108. To grow the probe points, the support ring 122 and its attached layers are put in a float (not shown), and the float placed in an electrolytic solution containing gold with the exposed ends of the vias 108 as shown in FIG. 9 immersed in the solution. Voltage is applied and the probe points such as 132 grow by electrolyzation at the ends of the vias 108.

The probe points such as 132 are thus made of gold in the preferred embodiment and grow out of the central part 124 of the test surface as shown in FIG. 12. The probe points such as 132 are 2 to 4 microns in diameter, and about 4 microns high. They connect with the metal in each via, and hence to the two metallization layers. The pattern of probe points such as 132 on the tester surface is unique, and corresponds to the contact test points on the wafer to be tested.

Several kinds of probe points 132 can be provided. In an alternative embodiment, probe point height is determined by a mask. To provide masked probe points, a mask containing vias is formed on surface 130 at the probe point locations, then the points grown in the vias and then the mask removed. The probe points can be aluminum or other suitable metals or conductive materials.

The tester surface itself can be fabricated with elastomeric probe points such as conductive doped polyacetylene (personal contact with Professor Alan G. Mac Diarmid, University of Pennsylvania and also see "Plastics that Conduct Electricity", Scientific American, Feb., 1988, pgs. 106–111, by Richard B. Kaner and Alan G. MacDiarmid) that compress on contact with the contact points of the device or ICLU under test, to allow closer probe point spacing or to make the tester surface more flexible. Such elastomeric materials are applied and etched with established techniques.

In a slightly different method to fabricate the tester surface, the substrate wafer first has etched in its center a circular depression one to two inches in diameter and typically twenty microns deep. This depression will impart a gradual extension to the outer part of the tester surface, so that the center part of the finished surface will extend slightly below the surrounding tester surface.

Figure 13:
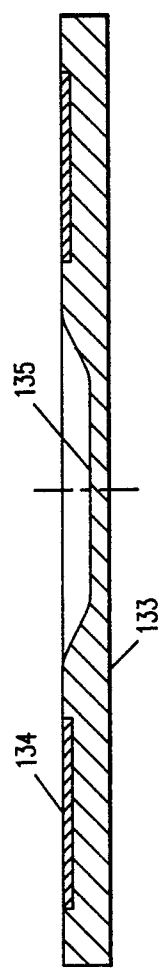
FIGS. 13-15 show the steps to fabricate another embodiment of the tester surface.
Figure 14:
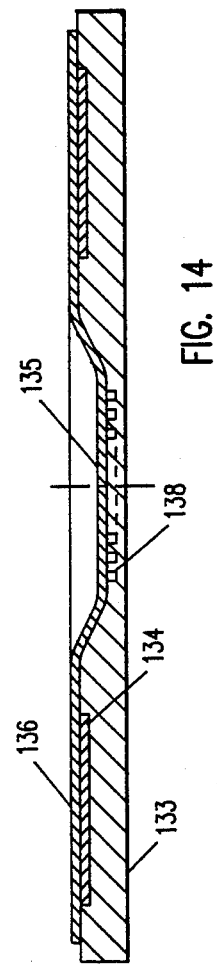
Figure 15:
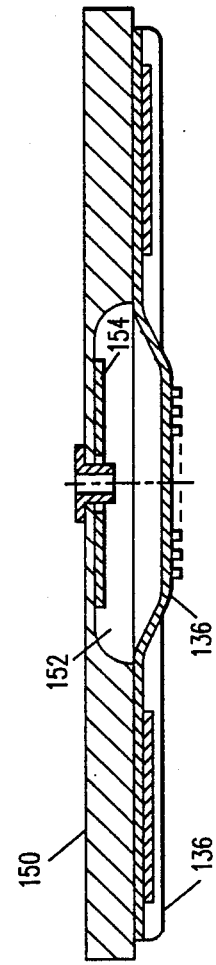

A different tester surface is illustrated in FIGS. 13–15. Here the multiplexer circuits and tester logic are integrated into the tester surface. FIG. 13 shows how, as before, starting with a standard semiconductor wafer 133, multiplexer and tester logic circuitry 134 is fabricated on the surface of wafer 133. Then, as described above, a depression 135 is etched in the center of wafer 133. The depression 135 is again one to two inches in diameter and typically twenty mils deep. Then, as shown in FIG. 14, several layers of silicon dioxide and metallization 136 are formed on the wafer over depression 135 and over the logic sites 134. In this embodiment, the tester probe point array sites such as 138 may (optionally) be etched into the surface of the wafer 133 in the depression, to allow preformation of the probe points by filling the etched probe point sites 138 with metallization.

After the tester surface 136 (FIG. 14) is fully fabricated on wafer 133, the surface 136 is separated from wafer 133 s before by selective etching away of wafer 133. (Release agents cannot be used here since part of wafer 133 including logic sites 134 must remain as part of tester surface 136). The tester surface 136 is attached to a support ring 150 before the step selective etching as shown in FIG. 15, and used in the same manner as described above with a fluid well 152 and piezoelectric pressure cell 154 provided.

Depending on their shape and material, the probe points such as 132 in the various embodiments will exhibit mechanical wear when in use to probe the wafer under test. When worn below tolerance, the points can be refurbished by dipping in aqua regia to remove them, and then renewed with the eletrolytic process as before, to produce a remanufactured surface.

Figure 16:
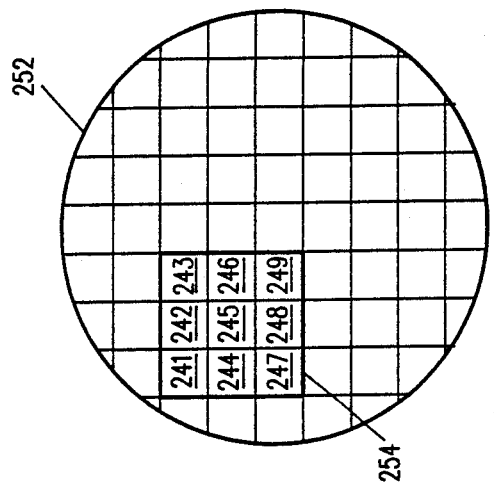
FIG. 16 shows how nine die can form one super die.

The above description of embodiments of this invention is intended to be illustrative and not limiting. For instance, very large circuits can be produced by testing and metallizing nine adjacent die 240 to 249 (in a 3×3 array) on a wafer 252 as shown in FIG. 16, and then interconnecting the nine die to form one super die 254.

Alternatively, the invention can be practiced not only at the transistor level, but at the ICLU level such as a standard gate or custom gates or memory devices. This involves fewer contact points, and requires redundancy to be provided in the form of extra gates or groups of gates to replaced defective ICLU's. The invention is also not restricted to gate arrays, and could be practiced on any kind of integrated circuit (e.g., custom logic or DRAM).

If the tester surface probe points are enlarged to sized of 2×2 mils to 4×4 mils, the tester surface would have an additional utility as a functional circuit tester for die-sorting purposes after the manufacturing of the circuit is completed. This application would increase pin count density over the prior art technology.

The tester surface can be fabricated from flexible materials other than silicon dioxide, such as silicon nitride or polymers, so long as the materials physically support vias and conductive traces.

In another embodiment, the tester interconnections are formed on the surface of the wafer to be tested.

In this embodiment, instead of fabricating a tester surface of N×M test points in a grid with an interconnecting set of metallization layers fabricated in the tester surface, the interconnection metallization is fabricated on the surface of the wafer (forming direct metallization contact to the ICLU contact points) and the probe points are arranged as a ring around this on-wafer tester interconnect structure. This process would form the same electrical connection path to the ICLUs to be tested as in the previously described embodiments. The advantage here is that much smaller ICLU or contact points could be accessed, or alternatively this embodiment allows wider spacing of tester surface probe points and requires fewer of them, i.e. only N+M points. This embodiment greatly increases the potential operable range of the invention with only a small increase in processing costs for the on-wafer metallization structure. The on-wafer metallization structure is temporary. It is fabricated out of a metal such as aluminum and a separation dielectric layer of resist. Once the on-wafer interconnect structure has been used to test the ICLUs or devices by the tester surface, the interconnect structure is etched from the surface of the wafer by normal wafer cleaning methods.

Other embodiments of the invention will be obvious to those skilled in the art in view of the above disclosure.

I claim:

1. A method of making an integrated circuit comprising the steps of:
   testing simultaneously a plurality of individual logic units of said integrated circuit prior to interconnecting said logic units; with each of the units being electrically isolated from the other units during the test and
   interconnecting said logic units so as to render said integrated circuit operable.

2. The method of claim 1, wherein said step of testing said logic units is prior to the step of interconnecting any of said logic units.

3. The method of claim 1, further comprising the step of providing a flexible tester surface comprising a layer of silicon dioxide and having a thickness of less than 15 microns; and
   wherein said step of testing comprising the step of bringing the flexible tester surface into electrical contact with said logic units by fluid pressure means exerted on said tester surface.

4. The method of claim 1, further comprising the step of revising a net placement list of said integrated circuit by CAD means so as to include in said revised placement net list only those logic units that pass said testing.

5. The method of claim 1, further comprising the steps of:
   interconnecting said logic units by a thin conductive film; and
   patterning said film by Electron-beam means.

6. A method of making an integrated circuit comprising the steps of:
   forming temporary interconnections between the logic units prior to testing;
   testing individual logic units of said integrated circuit prior to interconnecting said logic units;
   removing said temporary interconnections after testing; and
   interconnecting said logic units so as to render said integrated circuit operable.

7. The method of claim 6, wherein said temporary interconnections are formed of a conductive layer and a dielectric layer.

8. The method of claim 4, wherein the step of revising the net placement list routing includes recomputation of the metallization trace routing.

9. The method of claim 4, wherein the step of revising the net placement list includes selected localized changes of the metallization trace routing.

10. The method of claim 9 wherein the step of revising the net placement list is performed using a CAD rip-up router.

11. The method of claim 3, further comprising the step of providing the tester surface with probe points having a diameter of about 2 to 4 microns for electrically contacting the logic units.

12. The method of claim 3, further comprising the step of providing more than one thousand probe points on the tester surface.

13. The method of claim 1, further comprising the steps of:
   providing a piezoelectric pressure cell located at a backside of the flexible tester surface; and
   wherein the step of testing includes the step of providing a voltage to the piezoelectric pressure cell so as to bring the tester surface into electrical contact with said logic units.

14. The method of claim 7, wherein said temporary interconnections further are formed of a second conductive layer and a second dielectric layer, and said conductive layer and said second conductive layer are connected by electrically conductive vias.

15. The method of claim 3, further comprising the step of providing the flexible tester surface with a plurality of probe points having a spacing between the centers of adjacent probe points equal to a spacing between contacts of one transistor in the integrated circuit.

16. The method of claim 15, wherein the spacing is less than about 15 μm between centers of adjacent probe points.

17. The method of claim 1, further comprising the steps of:
providing redundant logic units in each portions of the integrated circuit;
and wherein the step of interconnecting includes the step of interconnecting the redundant logic units with the adjacent individual logic units.

18. The method of claim 1, further comprising the step of providing a flexible tester surface; and wherein said step of testing comprises the step of bringing the flexible tester surface into electrical contact with said logic units by pressure exerted on said flexible tester surface.

19. A method of making an integrated circuit comprising the steps of:
providing contact pads for testing logic units, the contact pads each having a size of less than about 25 microns by 25 microns;
testing individual logic units of said integrated circuits by contacting said contact pads prior to interconnecting said logic units; and
interconnecting said logic units so as to render said integrated circuit operable.

20. The method of claim 19, wherein the contact pads have a size of about 4 microns by 4 microns.

* * * * *

UNITED STATES PATENT AND TRADEMARK OFFICE
CERTIFICATE OF CORRECTION

PATENT NO.   : 4,924,589
DATED        : May 15, 1990
INVENTOR(S)  : Glenn J. Leedy It is certified that error appears in the above-identified patent and that said Letters Patent is hereby corrected as shown below:

Col. 1, line 34, change "fir" to --first--.

Col. 1, lines 45-47, "As is well . . . 15 microns (μm)." should not be a new paragraph.

Col. 3, line 14, change "of" to --or-- (second occurrence).

Col. 3, lines 35-36, "It is also . . . the ICLU's." should not be a new paragraph.

Col. 5, line 27, change "defectfree" to --defect-free--.

Col. 8, lines 26-27, change "Mac Diarmid" to --MacDiarmid--.

Col. 8, line 39, change "microns" to --mils--.

Col. 8, line 63, change "s" to --as--.

UNITED STATES PATENT AND TRADEMARK OFFICE
CERTIFICATE OF CORRECTION

PATENT NO. : 4,924,589

DATED : May 15, 1990

INVENTOR(S) : Glenn J. Leedy

It is certified that error appears in the above-identified patent and that said Letters Patent is hereby corrected as shown below:

Col. 9, line 21, change "replaced" to --replace--.

Col. 9, line 25, change "sized" to --sizes--.

Col. 10, line 1, (Claim 1) delete the semicolon (;) after "units".

Col. 10, line 3, (Claim 1) change "test" to --test;--.

Signed and Sealed this

Twenty-eighth Day of April, 1992

Attest:

HARRY F. MANBECK, JR.

*Attesting Officer*       *Commissioner of Patents and Trademarks*